(12) United States Patent
Basin et al.

(10) Patent No.: US 9,761,765 B2
(45) Date of Patent: Sep. 12, 2017

(54) LED WITH HIGH THERMAL CONDUCTIVITY PARTICLES IN PHOSPHOR CONVERSION LAYER

(71) Applicant: KONINKLIJKE PHILIPS N.V., Eindhoven (NL)

(72) Inventors: Grigoriy Basin, San Jose, CA (US); Mikhail Fouksman, San Jose, CA (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/782,774

(22) PCT Filed: Apr. 2, 2014

(86) PCT No.: PCT/IB2014/060366
§ 371 (c)(1),
(2) Date: Oct. 6, 2015

(87) PCT Pub. No.: WO2014/167458
PCT Pub. Date: Oct. 16, 2014

(65) Prior Publication Data
US 2016/0043285 A1 Feb. 11, 2016

Related U.S. Application Data

(60) Provisional application No. 61/809,451, filed on Apr. 8, 2013.

(51) Int. Cl.
*H01L 33/50* (2010.01)
*H01L 25/075* (2006.01)
(Continued)

(52) U.S. Cl.
CPC ............ *H01L 33/501* (2013.01); *H01L 24/97* (2013.01); *H01L 25/0753* (2013.01);
(Continued)

(58) Field of Classification Search
None
See application file for complete search history.

(56) References Cited

U.S. PATENT DOCUMENTS

2007/0194676 A1  8/2007  Tanda et al.
2007/0264739 A1* 11/2007  Chew ................... H01L 33/52
                                                               438/46
(Continued)

FOREIGN PATENT DOCUMENTS

DE     102008030253 A1   12/2009
EP          2336230 A1    6/2011
JP         2008124153 A    5/2008

OTHER PUBLICATIONS

EPO as ISA, PCT/IB14/60366, "International Search Report and Written Opinion", dated Jul. 1, 2014, 12 pages.

*Primary Examiner* — Khaja Ahmad
(74) *Attorney, Agent, or Firm* — Brian D. Ogonowsky; Patent Law Group LLP

(57) ABSTRACT

In one embodiment, a solid cylindrical tablet is pre-formed for a reflective cup containing an LED die, such as a blue LED die. The tablet comprises uniformly-mixed phosphor particles and transparent/translucent particles of a high TC material, such as quartz, in a hardened silicone binder, where the index of refraction of the high TC material is matched to that of the silicone to minimize internal reflection. Tablets can be made virtually identical in composition and size. The bulk of the tablet will be the high TC material. After the tablet is placed in the cup, the LED module is heated, preferably in a vacuum, to melt the silicone so that the mixture flows around the LED die and fills the voids to encapsulate the LED die. The silicone is then cooled to harden.

17 Claims, 2 Drawing Sheets

(51) Int. Cl.
*H01L 33/52* (2010.01)
*H01L 33/60* (2010.01)
*H01L 33/64* (2010.01)
*H01L 23/00* (2006.01)

(52) U.S. Cl.
CPC .............. H01L 33/52 (2013.01); H01L 33/60 (2013.01); H01L 33/644 (2013.01); *H01L 33/505* (2013.01); *H01L 2924/0002* (2013.01); *H01L 2924/12041* (2013.01); *H01L 2933/005* (2013.01); *H01L 2933/0041* (2013.01); *H01L 2933/0058* (2013.01); *H01L 2933/0075* (2013.01)

(56) References Cited

U.S. PATENT DOCUMENTS

| | | | |
|---|---|---|---|
| 2011/0069490 A1 | 3/2011 | Liu | |
| 2011/0121331 A1* | 5/2011 | Simonian | H01L 33/504 257/98 |
| 2011/0140289 A1* | 6/2011 | Shiobara | C08K 3/34 257/789 |
| 2011/0244636 A1* | 10/2011 | Kondo | H01L 23/49822 438/127 |
| 2011/0309393 A1* | 12/2011 | Greenwood | H01L 33/505 257/98 |
| 2012/0052608 A1* | 3/2012 | Yoo | H01L 33/505 438/27 |
| 2013/0200413 A1* | 8/2013 | Kashiwagi | H01L 33/50 257/98 |

* cited by examiner

LED WITH HIGH THERMAL CONDUCTIVITY PARTICLES IN PHOSPHOR CONVERSION LAYER

The present application is a 371 application of International Application No. PCT/IB2014/060366 filed on Apr. 2, 2014 and entitled "LED WITH HIGH THERMAL CONDUCTIVITY PARTICLES IN PHOSPHOR CONVERSION LAYER," which claims the benefit of U.S. Provisional Application Ser. No. 61/809,451, filed on Apr. 8, 2013.

FIELD OF THE INVENTION

This invention relates to light emitting diodes (LED) and, in particular, to an LED die in a reflective cup filled with a wavelength conversion layer.

BACKGROUND

It is well known to mount a blue LED die in a conical reflective cup and then fill the cup with a drop of a viscous phosphor mixture. The mixture is then cured. If the phosphor is a YAG phosphor, white light will be created by the combination of the yellow-green YAG emission and blue light leaking through the cured phosphor mixture.

A common phosphor mixture comprises phosphor powder in a transparent binder, such as silicone or epoxy. Such binders have very poor thermal conductivity (TC), such as 0.1-0.2 W/mK, and make up the bulk of the phosphor mixture. Accordingly, the overall TC of the hardened phosphor mixture is very low.

Due to the low TC, heat is not conducted from the LED die through the phosphor mixture and to the cup walls and base. Accordingly, the LED operates at a relatively high temperature. If the LED operates at a high temperature, its light output becomes lower and its color shifts over its lifetime. Therefore, the low TC phosphor mixture limits such reflector cup applications to low and medium current/heat LEDs.

What is needed is a technique that allows a high brightness/high current/high heat LED to be encapsulated by a phosphor mixture in a reflective cup.

In addition to the problem addressed above, the phosphor mixture must have a low viscosity in order for it to be used with a small-diameter dispensing nozzle under practical injection pressures and to fill in the voids around the LED die. A typical phosphor mixture may produce uneven phosphor density in the deposited mixture due to the rapid slurry flow and the low viscosity of the mixture. Additionally, the phosphor mixture viscosity permits phosphor particles in the dispensed volume to settle to the bottom of the cup before the phosphor mixture is cured. Due to this phosphor settling inside the cup, it is difficult to maintain the targeted color of the package. Further, it is difficult to repeatedly dispense identical amounts of the viscous phosphor mixture in the cups, which causes non-uniformity of color from LED module to LED module.

What is needed is a technique to improve the color consistency from LED module to LED module and to improve the color uniformity of the package.

SUMMARY

The present invention solves the problems addressed above.

In one embodiment, a solid cylindrical tablet is pre-formed for each reflective cup containing an LED die, such as a blue LED die. The tablet diameter is preferably such that the side edges of the tablet abut the cup walls while the bottom of the tablet contacts the top of the LED die. This causes the tablet to be centered. However, precise placement is not required to achieve the goals of the invention.

The tablet has an overall high thermal conductivity (TC) and comprises uniformly-mixed phosphor particles and transparent (or translucent) particles of a high TC material in a silicone binder, with the index of refraction of the high TC material matched to that of the silicone. The particles are typically all on the order of a few microns in diameter, but a wide range of sizes is suitable for the invention.

The tablets may be made by mixing the solid phosphor and high TC particles in a viscous silicone binder at an elevated temperature (above the melting point of the silicone) to form a slurry, and the slurry is poured in a mold to make a uniformly thick sheet. The slurry is then cooled to harden the sheet prior to any settling of the particles. The tablets are then stamped or "punched" out so they are virtually identical in composition and size.

In another embodiment, the silicone is viscous at room temperature and cured by heat, UV, or other methods.

The cured tablets or sheet can also be tested or further processed (e.g., thinned) so as to be precisely matched to a target color point. Thus, all completed LED packages/modules will generate a consistent target color.

In one embodiment, the high TC particles are a quartz, such as the mineral crystobalite. Crystobalite has a thermal conductivity of more than 3 W/mK, which is at least an order of magnitude greater than that of silicone. Glass beads/particles or other suitable materials, with their index of refraction matched to that of the silicone, may also be used. The high TC particles should be transparent or translucent. The bulk of the phosphor mixture will be the high TC material.

The high TC particles and the silicone are selected so that their indices of refraction (n) are as close as practical to one another to minimize internal reflection. The index of refraction of both materials will typically be around 1.49. Silicone and quartz powders with a variety of indices of refraction are commercially available.

After the tablet is placed in the cup, the LED module is heated, preferably in a vacuum, to melt the silicone so that the mixture flows around the LED die and fills the voids to encapsulate the LED die. The melting temperature of the silicone is higher than the maximum operating temperature of the LED module. The mixture conforms to the cup shape and will have a substantially flat top surface. The viscosity of silicone can be made very low when heated. After melting, the mixture will have a substantially uniform distribution of phosphor and a substantially flat top surface.

The mixture is then cooled or otherwise cured to harden.

By using solid pre-formed tablets, handling of the phosphor mixture is much easier than handling of the prior art viscous mixture, and the volume of the phosphor mixture per cup is more precise.

Since the phosphor mixture has a high TC, higher brightness/higher heat LED dies may be used since the heat is conducted away by the phosphor mixture. Further, the phosphor mixture can be made to have a very uniform density of phosphor for high color uniformity. Further, since each tablet may be easily formed to have the same characteristics, there will be good color consistency from LED module to LED module. Further, since the phosphor mixture is not dispensed as a liquid, the top surface of the phosphor mixture may be very flat so there is good color vs. viewing angle uniformity. Other advantages exist.

Balls or other shapes may be used instead of the tablets. In some embodiments, a tablet sheet is pressed and thinned to a precise thickness, then the tablets are stamped out and placed in the cup. Each tablet is then melted to conform to the cup and the LED die.

The process may be formed on a wafer scale, where many LED modules are simultaneously formed.

Quantum dots may be used instead of phosphor.

BRIEF DESCRIPTION OF THE DRAWINGS

Elements that are the same or similar are labeled with the same numeral.

DETAILED DESCRIPTION

Figure 1:
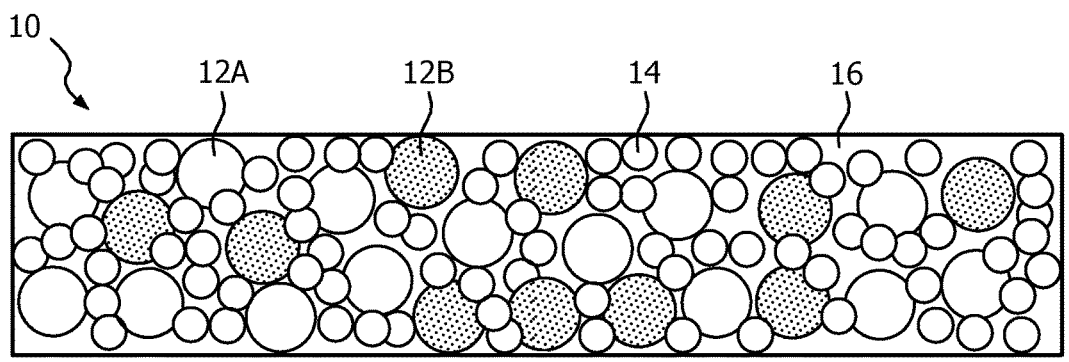
FIG. 1 is a magnified cross-sectional view of a single pre-formed tablet for wavelength-converting light emitted by an LED die in a reflective cup.

FIG. 1 is a magnified cross-sectional view of a single pre-formed tablet 10 for wavelength-converting light emitted by an LED die in a reflective cup. In one embodiment, the tablet 10 is cylindrical and has a diameter of about 2-4 mm, depending on the size of the cup. The height of the tablet 10 will typically be about 2-3 mm, depending on the volume of the cup.

The tablet 10 diameter is preferably such that the side edges of the tablet 10 abut the cup walls while the bottom of the tablet 10 contacts the top of the LED die. This causes the tablet 10 to be centered in the cup. However, precise placement is not required to achieve the goals of the invention.

Instead of a cylindrical form, a rounded form or even a ball may be used for each cup.

The tablet 10 comprises uniformly-mixed phosphor particles 12A, 12B and high TC particles 14 in a silicone binder 16. Phosphor particles 12A may be YAG phosphor and are shown as white large circles. Phosphor particles 12B may be red light emitting phosphor and are shown as shaded large circles. High TC particles 12 are shown as small white circles.

The phosphor particles may be all of one type (e.g., a YAG phosphor 12A) or of different types (e.g., a combination of YAG 12A and a red light emitting phosphor 12B). Although the phosphor particles are shown as uniformly large and the TC particles as uniformly small, any combination of large and small non-uniform phosphor particles, large and small non-uniform TC particles are contemplated and are included within the scope of the invention. Likewise the exemplary YAG phosphor particles 12A may be larger or smaller than the exemplary red phosphor particles 12B. Typically the particles 12A, 12B and 14 are all on the order of a few microns in diameter, but a wide range of sizes is suitable for the invention.

The tablets 10 may be made by mixing the solid particles 12A, 12B, and 14 in the desired ratio in a viscous silicone binder at an elevated temperature. The viscosity of the silicone reduces with temperature and, ultimately, the particles 12A, 12B, and 14 will be uniformly distributed throughout the binder. The resulting mixture (a slurry) is poured in a mold to make a uniformly thick sheet. The mixture is then hardened by cooling or other curing technique. The tablets 10 are then stamped out, sawed, or separated in other ways, so they are virtually identical in composition and size.

In another embodiment, the silicone is viscous at room temperature and cured by heat, UV, or other methods.

The sheet/tablet may be tested after being formed and categorized to precisely match the tablets 10 to a particular LED die peak wavelength.

In one embodiment, the high TC particles 14 are a quartz, such as the mineral crystobalite. The high TC particles 14 may be formed by grinding and grading the resulting powder. Crystobalite has a thermal conductivity of more than 3 W/mK, which is at least an order of magnitude greater than that of silicone (e.g., 0.2 W/mK). Glass beads/particles, a crystalline silica, or other suitable high TC particles, index matched to the silicone may also be used. The high TC particles 14 should be transparent or translucent.

The high TC particles 14 and the silicone 16 are selected so that their indices of refraction (n) are as close as practical to one another to minimize internal reflection. The index of refraction of both materials will typically be around 1.49. Silicone and quartz powders with a variety of indices of refraction are commercially available. The indices of refraction should be preferably matched to within about 0.1.

The phosphor particles 12A and 12B may comprise a mixture of red and green phosphor particles, or YAG phosphor particles, or any other types of phosphor(s), depending on the desired color emission of the LED module.

Figure 2:
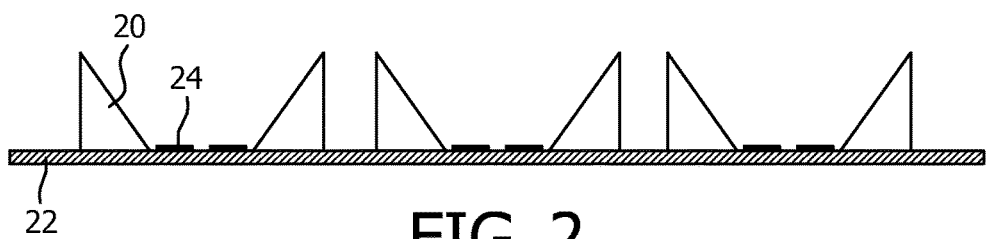
FIG. 2 is a cross-sectional view of a plurality of conical reflective cups supported on a substrate having electrodes for attachment to LED die electrodes.

The bulk of the phosphor mixture forming the tablet 10 will be the high TC material, so the resulting phosphor mixture, when encapsulating the LED die, will be a good conductor of heat, allowing the LED die to be a high brightness/high current/high heat type. FIG. 2 is a cross-sectional view of a plurality of conical reflective cups 20 supported on a substrate 22 having electrodes 24 for attachment to LED die electrodes. The electrodes 24 may extend to pads on the bottom of the substrate 22 for soldering to a printed circuit board after the substrate 22 is singulated. The substrate 22 will typically contain a large array of such cups 20 so that the processing is on a wafer scale to reduce costs and handling.

The cups 20 may be reflective metal rings, or may be resin coated with a reflective metal film or painted, or may be any other reflective material. The height of the cup 20 is typically on the order of about 1.5-3 mm for a single LED die.

Figure 3:
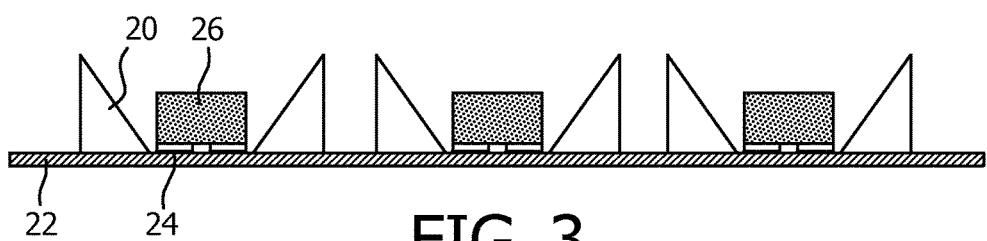
FIG. 3 illustrates flip chip LED dies mounted in the cups.

FIG. 3 illustrates conventional flip chip LED dies 26 mounted in the cups 20 and connected to the substrate electrodes 24. In one embodiment the LED dies 26 emit blue light.

Figure 4:
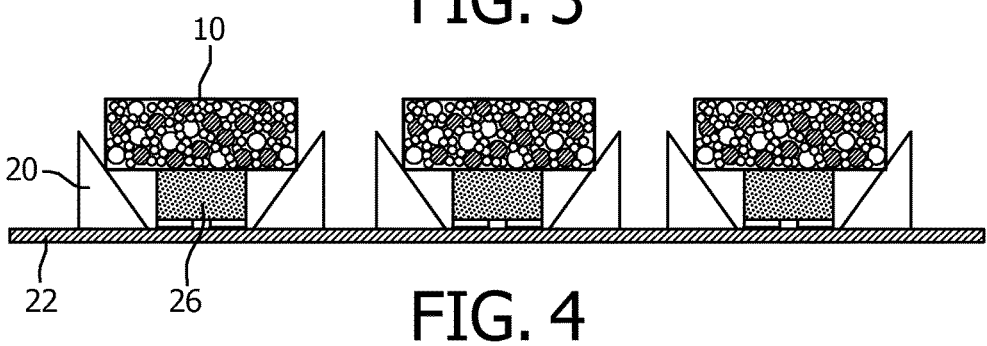
FIG. 4 illustrates the tablets positioned in each of the cups.

FIG. 4 illustrates the tablets 10 positioned in each of the cups 20 by a conventional pick and place machine. Note how the tablets 10 are centered due to the edges of the tablets 10 contacting the cup 22 walls. The tablets 10 may or may not extend above the top of the cups 20, depending on the height of the cups 20.

Figure 5:
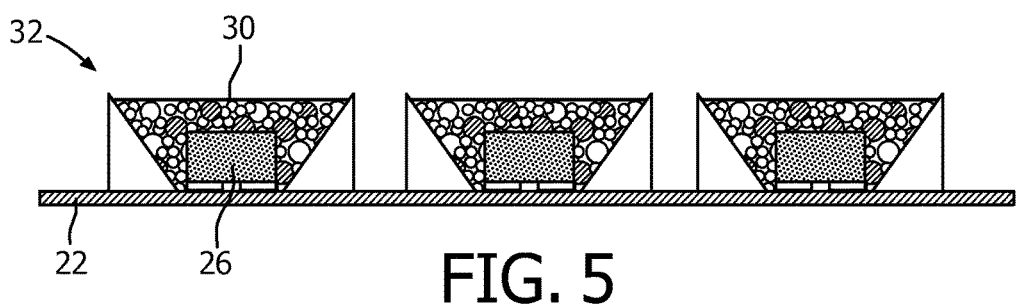
FIG. 5 illustrates the LED modules after undergoing a heating step under a vacuum to cause the silicone binder to melt and the phosphor mixture to encapsulate the LED dies.

In FIG. 5, the substrate 22 is placed in a vacuum and heated to raise the temperature of the silicone 16 above its melting point. Due to gravity, surface tension, and the vacuum, the void will be filled by the molten phosphor mixture to encapsulate the LED die 26. The structure is then cooled to room temperature to harden the silicone 16, or the silicone 16 is cured using other techniques (e.g., UV light). If the LED dies emitted UV light, and the binder was the type to be cured with UV, the LEDs may be energized to cure the binder.

The resulting phosphor mixture 30 has a substantially flat top surface, a precise volume of the phosphor mixture 30 is provided, and the density of the phosphor particles 12A and 12B (FIG. 1) is substantially uniform. Accordingly, the light emitted by each LED module 32 will be the same, and the color emission will be substantially uniform over a wide range of viewing angles. The relatively high viscosity of the phosphor mixture, the small sizes of the phosphor particles, the relatively short time that the phosphor mixture is in a melted state, and the slow movement of the phosphor mixture ensures that the phosphor particles remain uniformly distributed and do not settle.

The substrate 22 is then singulated, such as by sawing, to separate the LED modules 32.

FIGS. 6-9 illustrate the same process as FIGS. 2-5 but performed on LED modules having multiple LED dies 26 in each reflective cup.

Figure 6:
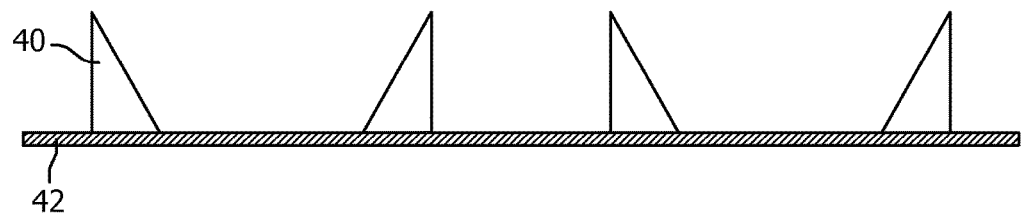
FIGS. 6-9 illustrate the same process as FIGS. 2-5 but performed on LED modules having multiple LED dies in each reflective cup.

In FIG. 6, relatively large reflective cups 40 are provided on a substrate 42, where the size depends on how many LED dies are to be mounted in each cup 40.

Figure 7:
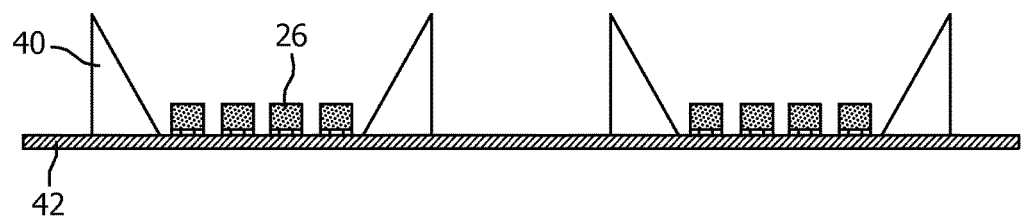

In FIG. 7, the LED dies 26 are mounted in the cups 40. In the example of FIG. 7, a circular array of 16 LED dies 26 connected in series are mounted in each cup 26. FIG. 7 is a cross-section across the center line of the cups 40. Although a circular array of LED dies is described, any other suitable arrangement such as a rectangular array of dies is contemplated and included within the scope of the invention.

Figure 8:
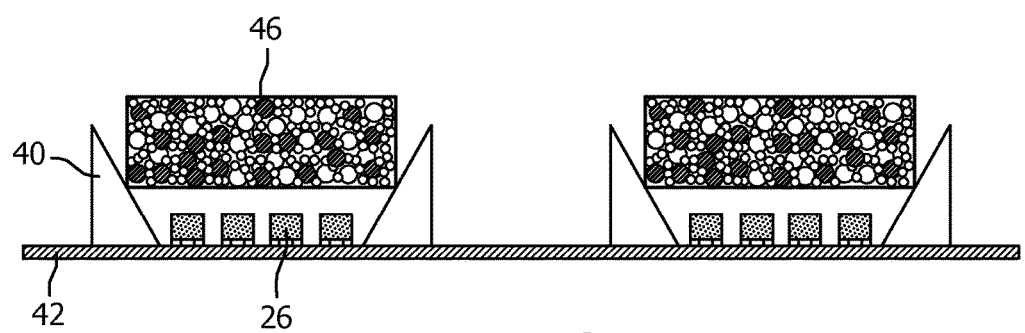

In FIG. 8, a large tablet 46, which may be identical to that of tablet 10 in FIG. 1 but larger, is positioned in each cup 40.

Figure 9:
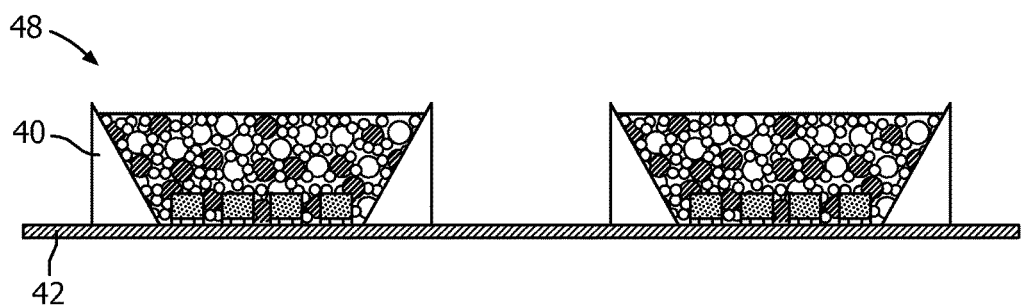

In FIG. 9, the substrate 42 is heated in a vacuum to melt the silicone to encapsulate the LED dies 26, as previously described.

The substrate 42 is then singulated to form individual LED modules 48.

In the various embodiments, the LED die 26 may be a blue die and the phosphor creates any desired color emission such as a white light emission for general illumination. Due to the high TC of the phosphor mixture, the LED dies 26 may be high brightness types, allowing the LED modules to be used for general illumination applications.

The phosphor particles 12A and 12B may be replaced by quantum dots or other wavelength converting particles. The silicone 16 may be replaced with any other suitable binder that can be softened or liquefied after being deposited in the cup and then hardened to encapsulate the LED die. LED dies other than flip chips may be used. In the above example, the high TC particles 14 had a thermal conductivity greater than ten times that of the binder (silicone 16); however, even a thermal conductivity greater than three times that of the binder will have beneficial effects. In the context of the present invention, the high TC particles are suitable materials whose TC is at least three times greater than the binder material to substantially increase the TC of the wavelength conversion mixture.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of fabricating a light emitting diode (LED) module comprising:
   providing a reflective cup containing at least one LED die;
   positioning a solid piece in the reflective cup and over the LED die such that no portion of the solid piece extends laterally beyond the reflective cup, wherein the solid piece contacts inner walls of the reflective cup and creates a void around the LED die below the solid piece, the solid piece comprising:
   a binder having a first index of refraction and a first thermal conductivity;
   wavelength conversion particles uniformly mixed in the binder that convert first light emitted by the LED die to second light of a different wavelength; and
   high thermal conductivity particles uniformly mixed in the binder, such that a bulk of the solid piece is the high thermal conductivity particles, the high thermal conductivity particles having a second index of refraction substantially equal to the first index of refraction and having a second thermal conductivity greater than the first thermal conductivity;
   after the solid piece is positioned, softening the solid piece to flow the wavelength conversion particles, the high thermal conductivity particles, and the binder around the LED die to directly contact and encapsulate the LED die such that all materials in the softened piece are within the reflective cup, wherein the solid piece containing the uniformly mixed wavelength conversion particles and the uniformly mixed high thermal conductivity particles directly contact the LED die to draw heat away from the LED die; and
   hardening the softened piece after encapsulation of the LED die.

2. The method of claim 1 wherein the step of softening the solid piece comprises heating the solid piece to melt the binder.

3. The method of claim 1 wherein the step of softening the solid piece is performed in a vacuum.

4. The method of claim 1 wherein the binder comprises silicone.

5. The method of claim 1 wherein the wavelength conversion particles comprise at least one phosphor.

6. The method of claim 1 wherein the high thermal conductivity particles comprise a quartz or crystalline silica.

7. The method of claim 1 wherein the high thermal conductivity particles comprise crystobalite.

8. The method of claim 1 wherein the high thermal conductivity particles comprise a glass.

9. The method of claim 1 wherein the high thermal conductivity particles comprise a majority of the solid piece.

10. The method of claim 1 wherein positioning the solid piece in the reflective cup comprises positioning the solid piece to be substantially centered in the reflective cup.

11. The method of claim 1 wherein the reflective cup is conical.

12. The method of claim 1 further comprising forming the solid piece by the method comprising:
    mixing the wavelength conversion particles and the high thermal conductivity particles in the binder while the binder is softened to form a slurry;
    forming a sheet of the slurry;
    hardening the binder; and
    separating the resulting hardened sheet into substantially identical solid pieces.

13. The method of claim 1 wherein the solid piece has a generally cylindrical shape.

14. The method of claim 1 wherein providing the reflective cup containing at least one LED die comprises providing a plurality of identical reflective cups on a substrate, each reflective cup containing at least one LED die.

15. The method of claim 1 wherein the hardened piece after encapsulation conducts heat from the LED die to the reflective cup and to a base of the reflective cup.

16. The method of claim 1 wherein the second thermal conductivity greater than three times the first thermal conductivity.

17. The method of claim 1 wherein the step of hardening the softened piece after encapsulation of the LED die causes the hardened piece to have a substantially flat top surface across the reflective cup.

* * * * *